(12) United States Patent
Soh et al.

(10) Patent No.: US 6,612,442 B2
(45) Date of Patent: Sep. 2, 2003

(54) TRAY FOR STORING SEMICONDUCTOR CHIPS

(75) Inventors: Swee Chuan Soh, Penang (MY); Tee Hock Lim, Bukit Mertajam (MY); Geap Wooi Goh, Bukit Mertajam (MY); Shuib Bin Hassan, Seberang Perai (MY)

(73) Assignee: Texchem-Pack (M) BHD, Penang (MY)

( * ) Notice: Subject to any disclaimer, the term of this patent is extended or adjusted under 35 U.S.C. 154(b) by 0 days.

(21) Appl. No.: 09/797,029

(22) Filed: Mar. 1, 2001

(65) Prior Publication Data

US 2002/0066694 A1 Jun. 6, 2002

(51) Int. Cl.[7] ................................................ B65D 73/02
(52) U.S. Cl. ........................................ 206/725; 206/815
(58) Field of Search ................................ 206/701, 718, 206/722, 724, 815, 725, 726, 565

(56) References Cited

U.S. PATENT DOCUMENTS

| | | | |
|---|---|---|---|
| 4,706,161 A | * 11/1987 | Buckingham | 174/51 |
| 5,400,904 A | 3/1995 | Maston, III et al. | |
| 5,547,082 A | * 8/1996 | Royer et al. | 206/564 |
| 5,772,038 A | * 6/1998 | Murata et al. | 206/564 |
| 5,957,293 A | * 9/1999 | Pakeriasamy | 206/565 |
| 6,082,547 A | * 7/2000 | Nentl et al. | 206/560 |
| 6,109,445 A | * 8/2000 | Beyer | 206/561 |
| 6,116,427 A | * 9/2000 | Wu et al. | 206/706 |
| 6,227,372 B1 | * 5/2001 | Thomas et al. | 206/454 |
| 6,230,896 B1 | * 5/2001 | Lambert | 206/564 |
| 6,264,037 B1 | * 7/2001 | Maston et al. | 206/725 |
| 6,334,574 B1 | * 1/2002 | Huang | 235/379 |
| 6,349,832 B1 | * 2/2002 | Han | 206/459.5 |
| 6,357,595 B2 | * 3/2002 | Sembonmatsu et al. | 206/564 |

* cited by examiner

*Primary Examiner*—Shian Luong
(74) *Attorney, Agent, or Firm*—Merchant & Gould P.C.

(57) ABSTRACT

A thermo-formed tray and tray assembly designed for the storage and transportation of integrated circuit packages for instance of the type known as a pin grid array or a flip chip pin grid array. The storage tray consists of a number of compartments or recesses usually in a layout of two or three rows by five columns. Each recess includes a central pedestal to support the integrated circuit package and an array of supports so that the chip can be held on both the obverse and reverse side of the package. The formed trays can be nested when empty and may provide storage space savings. The tray assembly includes a thermoformed tray and rigid peripheral frame, that may be injection molded peripheral frame, to give better rigidity to the assembly.

10 Claims, 9 Drawing Sheets

TRAY FOR STORING SEMICONDUCTOR CHIPS

DESCRIPTION

1. Field of Invention

This invention generally relates to the storage and transport of integrated circuit packages and devices for such storage and transport.

2. Background of Invention

This invention will generally be discussed in relation to integrated circuit packages of the type known in the industry as pin grid array (PGA) and its derivatives such as flip chip pin grid array (FCPGA) but the invention is not restricted to these particular types of integrated circuit packages but also to other sorts of electronic chips which have a plurality of pins extending from a body.

Storage trays for such integrated circuit packages have been produced by injection moulding processes. Such trays have problems with cost, weight and manufacturing complexity. Cost is a factor due to the amount of material required for injection moulding and the cost of that material and the manufacturing time. Problems also exist with such trays with stacking particularly when the trays are empty. Owing to the relatively thick sections used with injection moulding it is difficult to obtain a reduced volume when stacking empty trays.

An alternative moulding method involves the use of thermoplastic sheet materials. Thermoplastic materials have a number of known advantages. However, thermoplastic storage trays are typically not suitable for use for integrated circuit package storage trays due to their flexibility. A very flexible tray creates numerous handling problems.

One such example of such prior art is disclosed in U.S. Pat. No. 5,400,904. This specification discloses an injection moulded tray to hold a plurality of integrated circuit chips but it has weight problems with the thickness of the sections necessary for injection moulding. The particular configuration of the tray also does not allow for moulding reduced volume when stacking empty trays.

It is the object of this present invention to provide a storage and transport tray for integrated circuit packages which are considerably lighter and cheaper to manufacture and also provide other advantages.

It is also advantageous to have a storage tray which will support integrated circuit packages in an upside down position so that the pins can be inspected and it is a further object to provide a storage tray which provides this facility without the requirement of significantly more material and preferably without creating handling problems.

BRIEF OF THE DESCRIPTION OF THE INVENTION

A first embodiment of the invention is a tray assembly for storing a plurality of integrated circuit packages, the integrated circuit packages being of a type having a body and a plurality of downwardly depending peripheral pins, the tray being formed by drape or vacuum thermoforming, the tray assembly further including a frame joined to the periphery of the tray to provide rigidity to the tray assembly.

Preferably the frame is injection moulded and is preferably joined to the tray by hot staking. The frame may include indexing lugs. Preferably the tray has a substantially uniform wall thickness, an obverse side of the tray having a plurality of recesses with each recess having a base and a central pedestal to engage in use an underside portion of the integrated circuit package such that the downwardly depending peripheral pins do not touch the base and upstanding walls to engage sides of the integrated circuit package, access recesses in at least some of the walls such that an integrated circuit package when supported in the recess can be engaged for removal by gripping at its edges, each access recess extending below the level of the base whereby on a reverse side of the tray the access recesses provide projections defining a retention area for an integrated circuit package with its pins facing upwards.

Throughout this specification the term "obverse" will be used for the normally upper or top side of a support tray and the term "reverse" will be used for the normally lower or under side of a support tray.

The advantage of having the integrated circuit packages able to be supported and retained on both the obverse and reverse sides is that a pair of trays with a layer of integrated circuit packages sandwiched between them can be turned over so that the top tray can be removed so that the layer of integrated circuit packages can be viewed and in particular the pins of the next layer of chips can be inspected for any blemishes.

A second embodiment of the invention is directed to the tray per se. This embodiment is a tray for storing a plurality of integrated circuit packages, the integrated circuit packages being of a type having a body and a plurality of downwardly depending peripheral pins, the tray being formed by drape or vacuum thermoforming whereby to have a substantially uniform wall thickness, an obverse side of the tray having a plurality of recesses with each recess having a base and a central pedestal to engage in use an underside portion of the integrated circuit package such that the downwardly depending peripheral pins do not touch the base and upstanding walls to engage sides of the integrated circuit package, access recesses in at least some of the walls such that an integrated circuit package when supported in the recess can be engaged for removal by gripping at its edges, each access recess extending below the level of the base whereby on a reverse side of the tray the access recesses provide projections defining a retention area for an integrated circuit package with its pins facing upwards.

In a preferred form of the invention the access recesses are provided in a middle portion of each wall and the wall portions are provided at each corner of the recess.

Each pedestal may include a central recess.

Preferably each storage tray has a plurality of locating pins in use adapted to engage with the underside of an adjacent tray to enable stacking of a number of trays. The locating pins may be at the corners of each trays.

There may be provided indexing engagement points on the sides or ends of the trays so that the tray can be accurately transported through a piece of insertion equipment so that robotic arms and the like can accurately pick the integrated circuits from the tray.

Each storage tray may have a plurality or rows and columns with a recess at the intersection of each row and column and in a preferred embodiment of the invention there may be two rows and five columns.

Preferably, at the intersection of each wall portion of a recess a cutaway is provided such that the corner of an integrated circuit package when supported in the recess does not engage with the tray thereby preventing jamming of the integrated circuit package into the tray.

Preferably each of the various walls and portions of the storage tray according to this invention are angled or tapered so that the storage trays when empty may be stacked in a reduced volume for transport.

It will be seen therefore that the invention provides a storage tray using a thermo-forming method which provides advantages such as lower mould cost, quicker mould manufacturing lead time, lighter tray weight, lower material costs, faster tray manufacturing cycle costs and lower transportation costs. Essentially the thermoforming technique uses a thermoplastic sheet material which is heated to a softening temperature and draped over a mould and assisted by vacuum or pressure to form into the shape of the mould after which it is cooled until the material takes the shape of the mould.

Furthermore these trays may be used as part of a rigid tray assemble as described in the first embodiment of the invention.

Such a storage tray assembly may use larger storage trays as the overall assemble will be more rigid. This assembly would be rigid within fixed tray dimensions in accordance with established JEDEC standards. For example the tray assemble could have three rows of eight recesses to hold 24 semiconductor chips.

An advantage of using the trays of the second embodiment within the tray assembly of the first embodiment is that the overall tray assembles gain most of the advantages of the tray, and the assembles are stackable when empty. However, it is envisioned that it will not be possible to stack the assembles in a reduced volume due to the rigid frame.

This generally describes the invention but to assist with understanding reference will now be made to the accompanying drawings which show preferred embodiment s of the invention.

Figure 1:
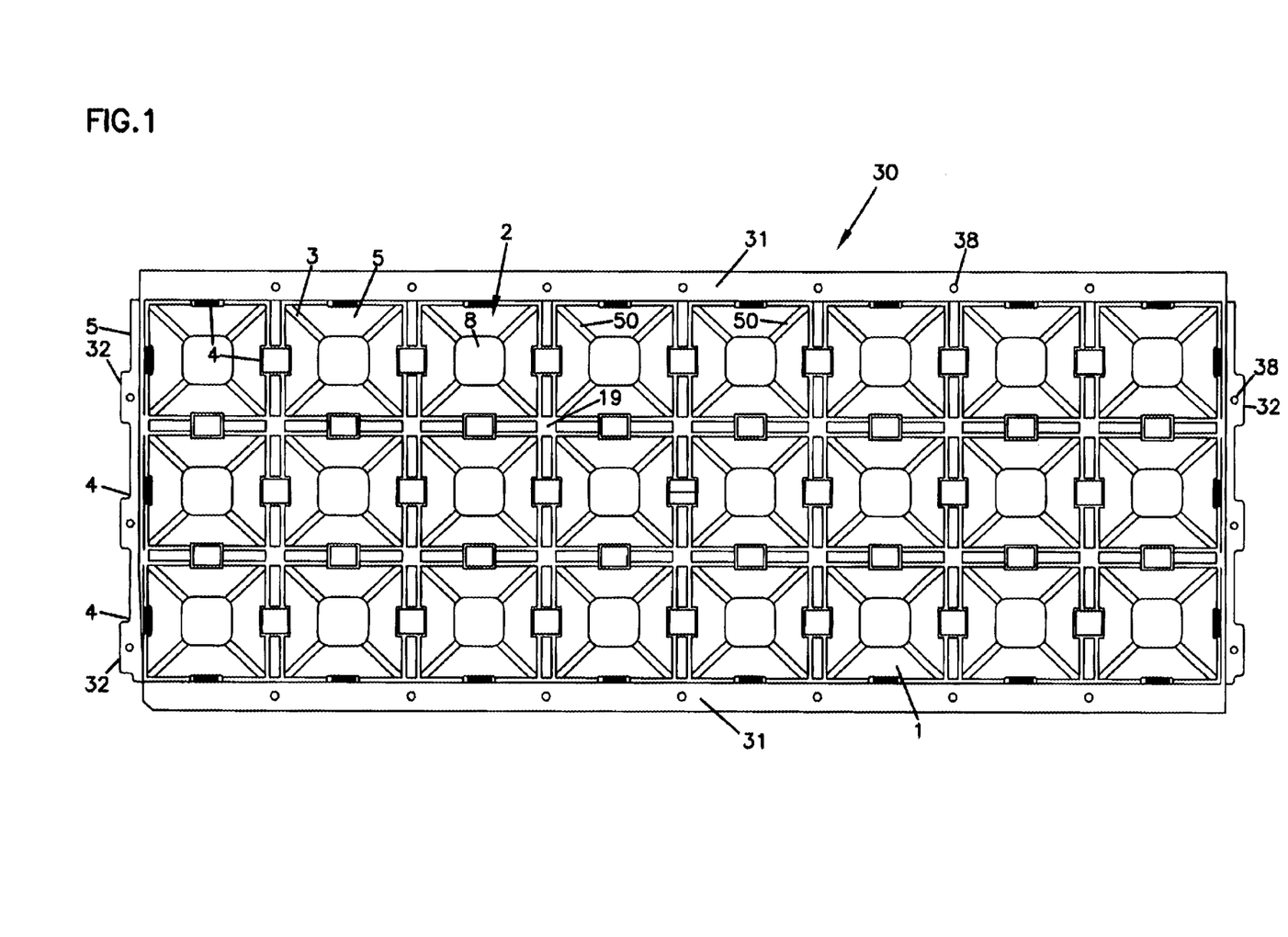
FIG. 1 shows a tray (a first component) of a tray assembly of the first embodiment of the invention.
Figure 2:
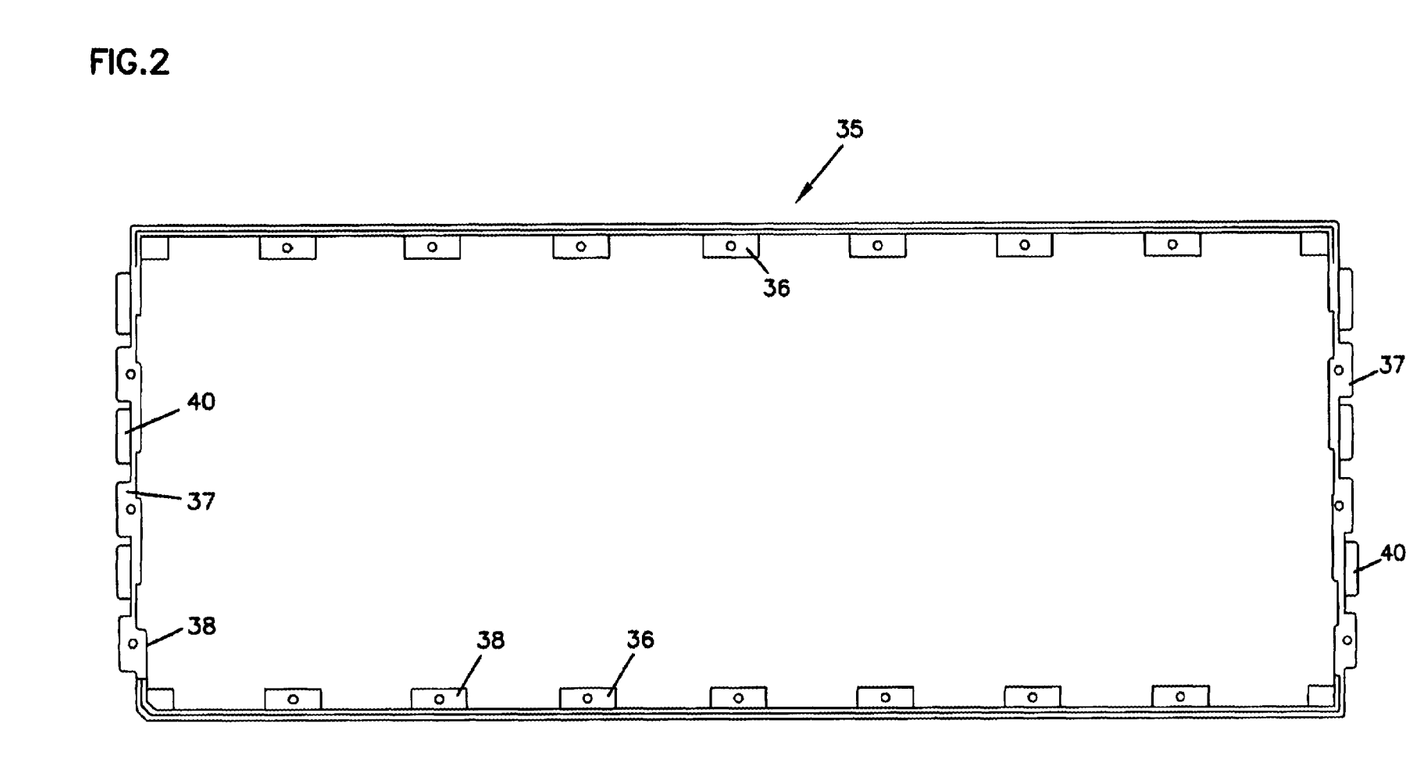
FIG. 2 shows a frame (a second component) of a tray assembly of the first embodiment of the invention.
Figure 3:
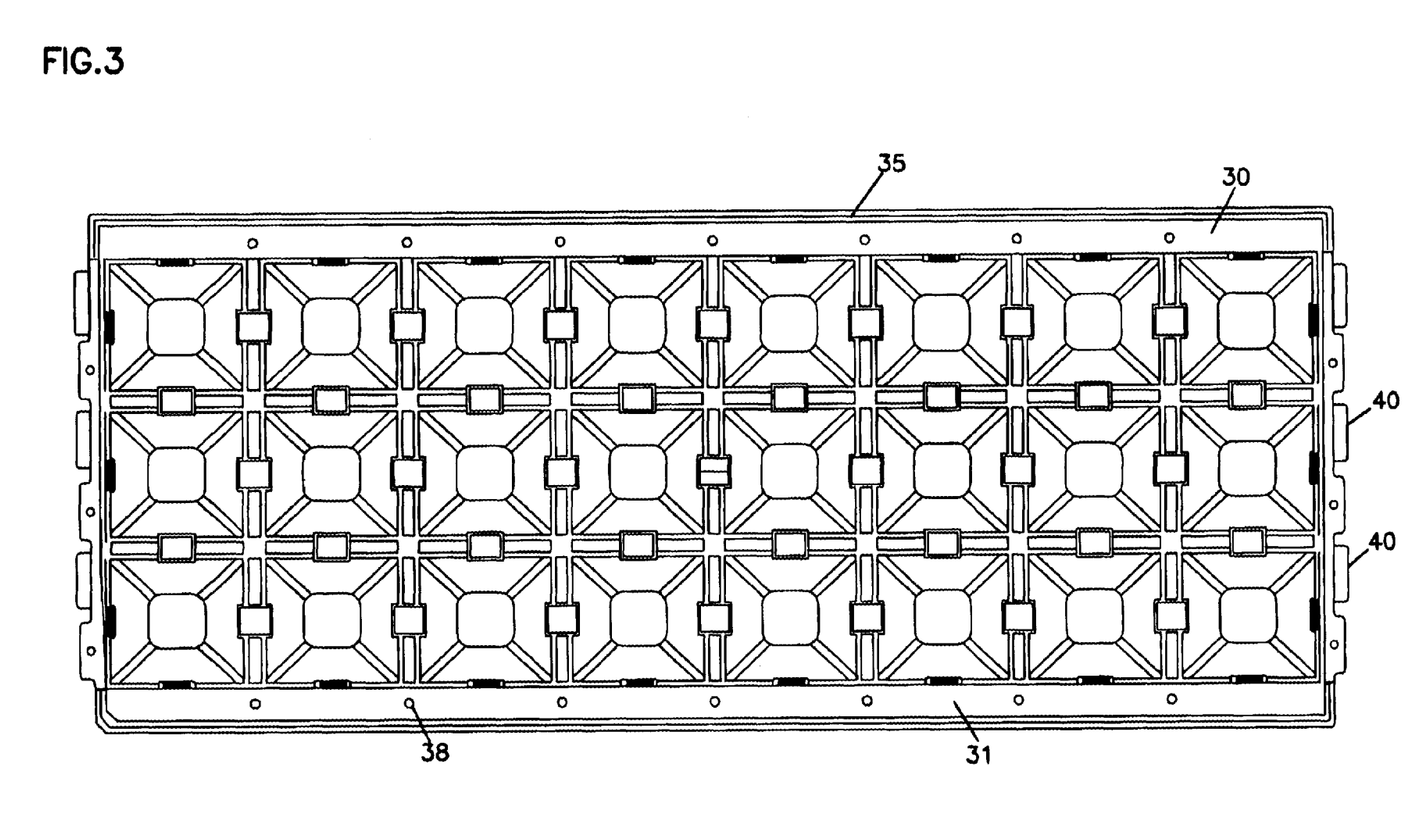
FIG. 3 shows the components of FIG. 1 and FIG. 2 joined together

FIGS. 1 to 8 show an embodiment of a chip tray assembly according to the invention. The assembly comprises a first component comprising a vacuum or drape formed tray as shown in FIG. 1 with a second component comprising an injection moulded frame as shown in FIG. 2. The tray assembly is shown in FIG. 3. The tray assembly has the advantage of lightness with rigidity.

In this embodiment the vacuum or drape formed tray 30 has three rows of eight chip recesses. Each recess 2 has a base 5 and a central pedestal 8. Each recess 2 is defined by a peripheral wall 3 and in the centre of each wall there is an access recess 4 The recess 2 include raised ribs 50 one side of the tray. The reverse side (not shown)of the tray 30 has indented channels in positions corresponding to the location of the raised ribs. The inclusion of this arrangement of ribs and channels provides some rigidity to the tray. Each tray has a peripheral rim 31 at the sides and lugs 32 at the ends. It will be noted that the frame 35 has outwardly extending lower indexing lugs 40 which assist with alignment of the tray when in an automatic placement machine.

The injection moulded frame 35 shown in FIG. 2 has a rectangular shape with a number of inwardly depending lugs 36 along its side and outward facing lugs 37 at the ends. Both the lugs 36 and 37 have pins 38 extending upwards. When the tray of FIG. 1 is placed in the frame of FIG. 2 as shown in FIG. 3 the pins extend through apertures 38 in the sides 31 and end lugs 32 and can be melted such as by hot melting to join the two components as shown in detail in FIG. 4.

Figure 4:
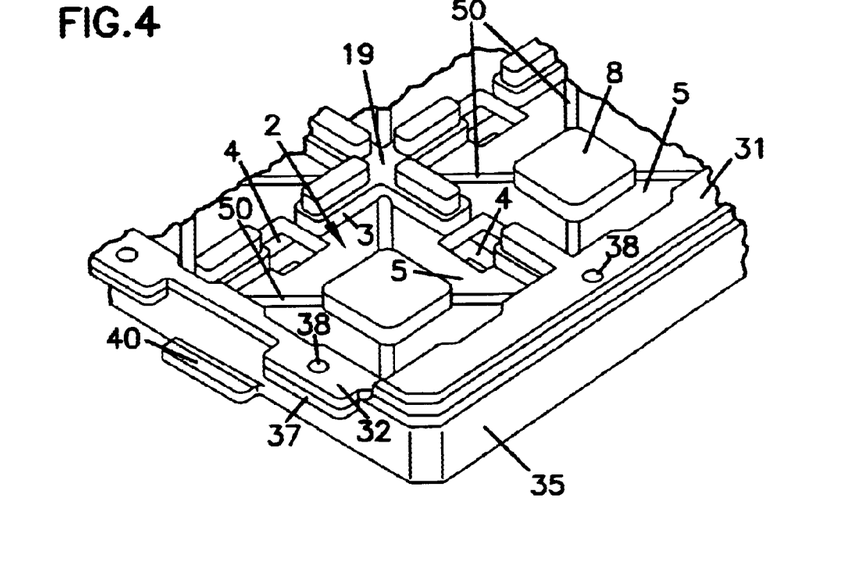
FIG. 4 shows a detail of the obverse side of the assembly shown in FIG. 3.
Figure 5:
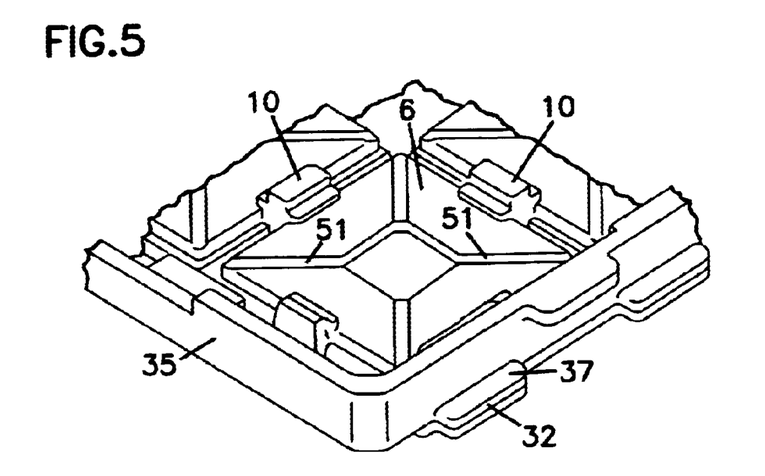
FIG. 5 shows a detail of the reverse side of the assembly shown in FIG. 3.

Detail of one corner of the assembly of the injection moulded frame 35 and the vacuum or drape formed tray 30 is shown in FIGS. 4 and 5. The recess 2 on the obverse side provides a support for an integrated circuit packaging (not shown) with the central underside of the integrated circuit package supported by the pedestal 8 and its pins around the pedestal but not touching the base 5. Each recess 2 is defined by a peripheral wall 3 and in the centre of each wall there is an access recess 4. The access recesses 4 extend below the level of the base such that on the reverse of the tray as can be seen in FIG. 5 the other sides of the access recesses 4 extend as projections 10 which provide together a retention area 6 for an integrated circuit package upside down. Likewise the channels 51 as seen in FIG. 5 extends as the ribs 50 as seen in FIG. 4.

Figure 6:
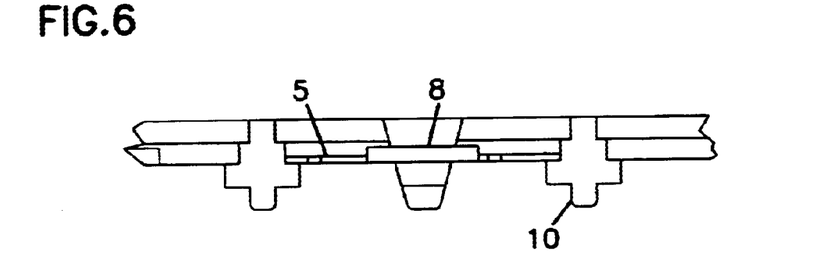
FIG. 6 shows a part cross sectional view of the storage tray of FIG. 3.
Figure 7:
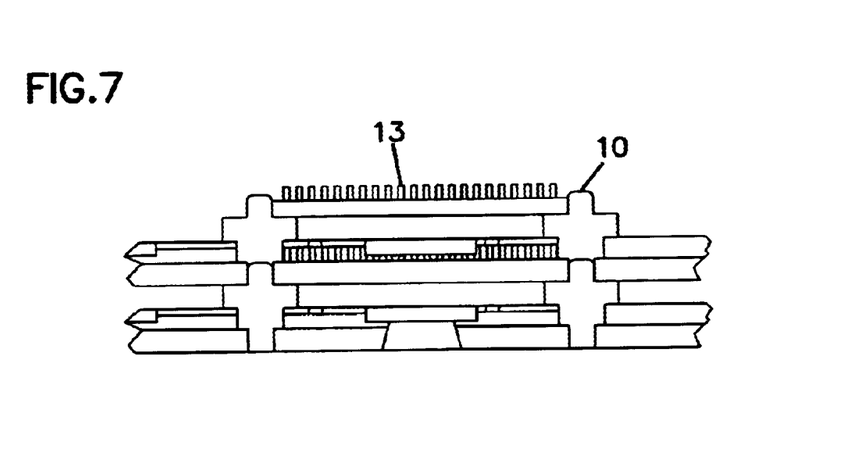
FIG. 7 shows a cross sectional view of a stack of tray assemblies of FIG. 3 with an integrated circuit package supported on the obverse side.
Figure 8:
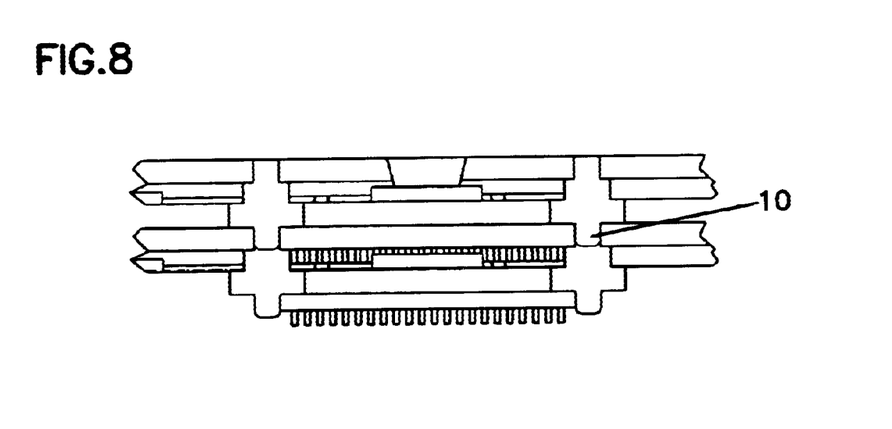
FIG. 8 shows a plurality of stacked trays assemblies of FIG. 3 in the reverse positions with integrated circuit packages supported between the projections.
Figure 9:
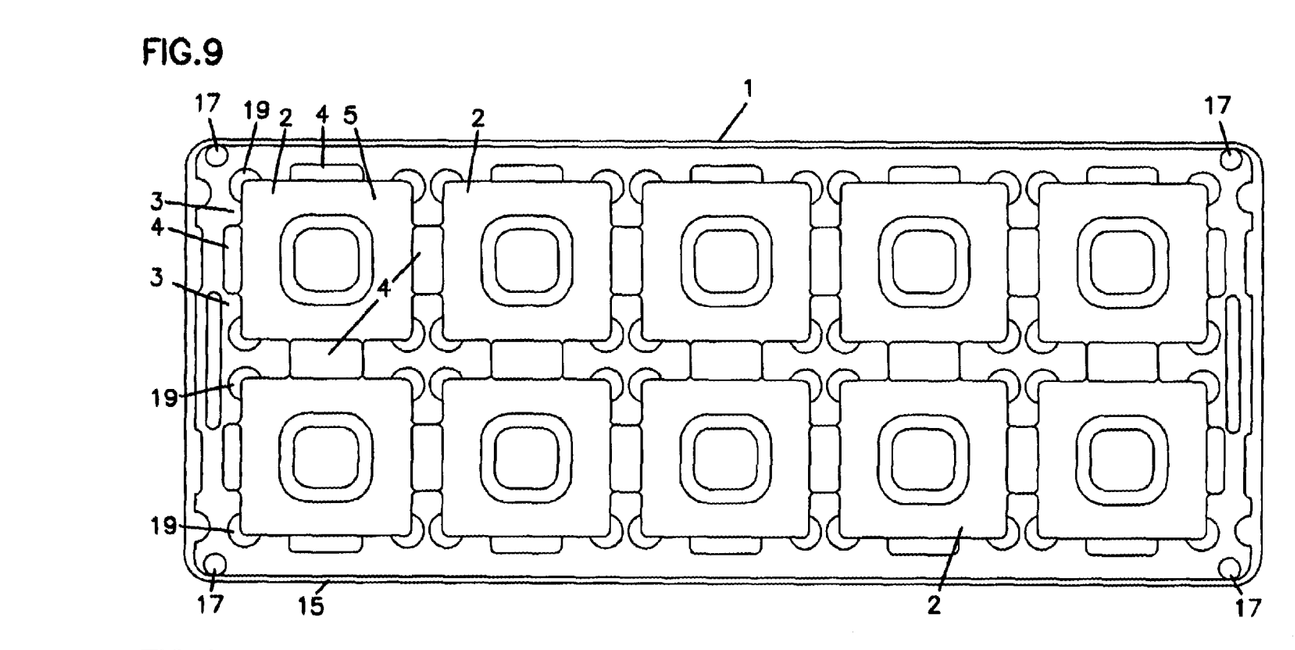
FIG. 9 shows a plan view of an alternative storage tray for integrated circuit packages according to this invention.
Figure 10:
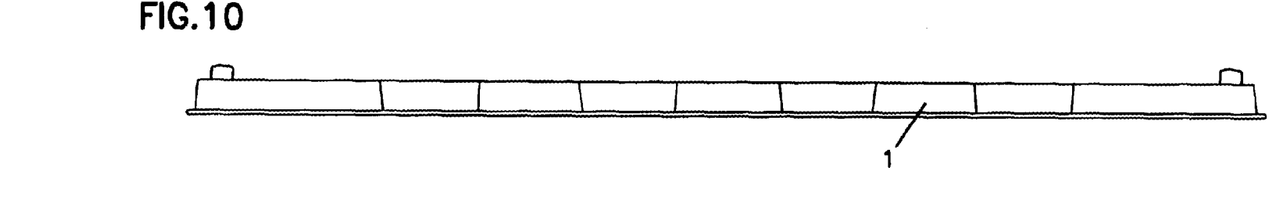
FIG. 10 shows a side view of the tray shown in FIG. 9.
Figure 11:
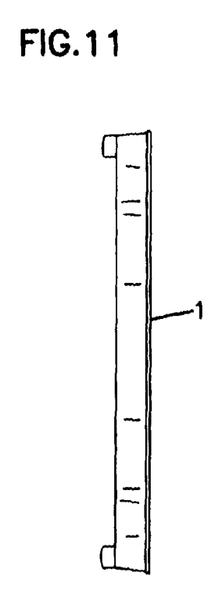
FIG. 11 shows an end view of the tray shown in FIG. 9.
Figure 12:
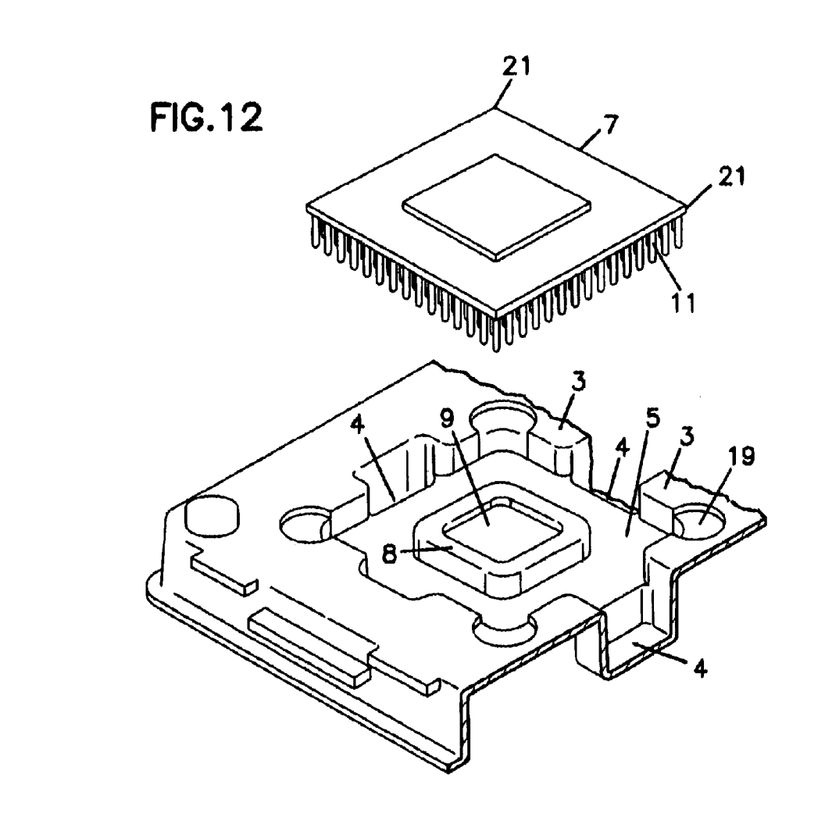
FIG. 12 shows a perspective of one corner of the obverse side of the storage tray shown in FIG. 9 with an integrated circuit package shown above it.

FIG. 6 shows a part cross section view of the tray assembly. The base 5, central pedestal 8 and projections 10 can been clearly seen. As shown in FIGS. 7 and 8 this arrangement allows integrated circuit packages 13 to be securely located in a stacked arrangement of tray assemblies.

Figure 13:
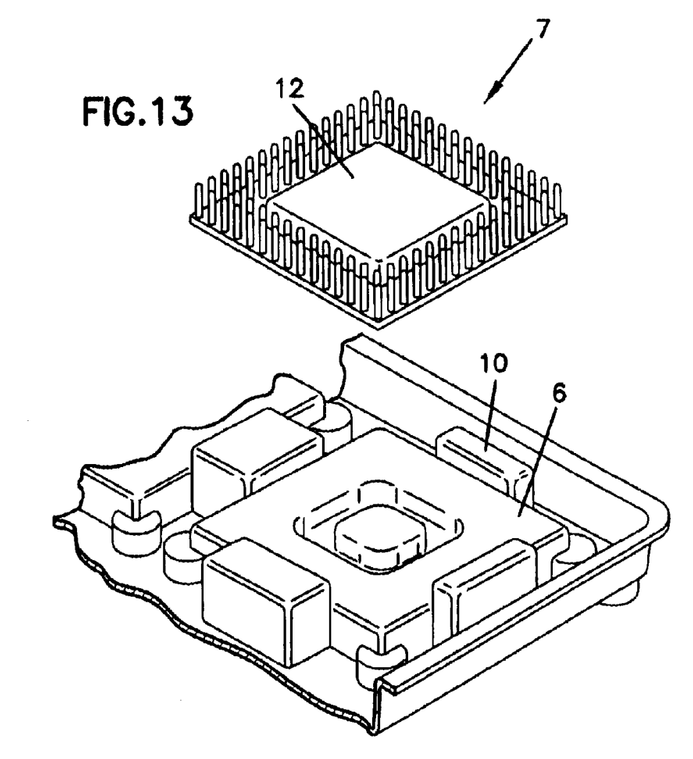
FIG. 13 shows the reverse view of one corner of the storage tray of FIG. 9 with the integrated circuit chip upside down above it.
Figure 14:
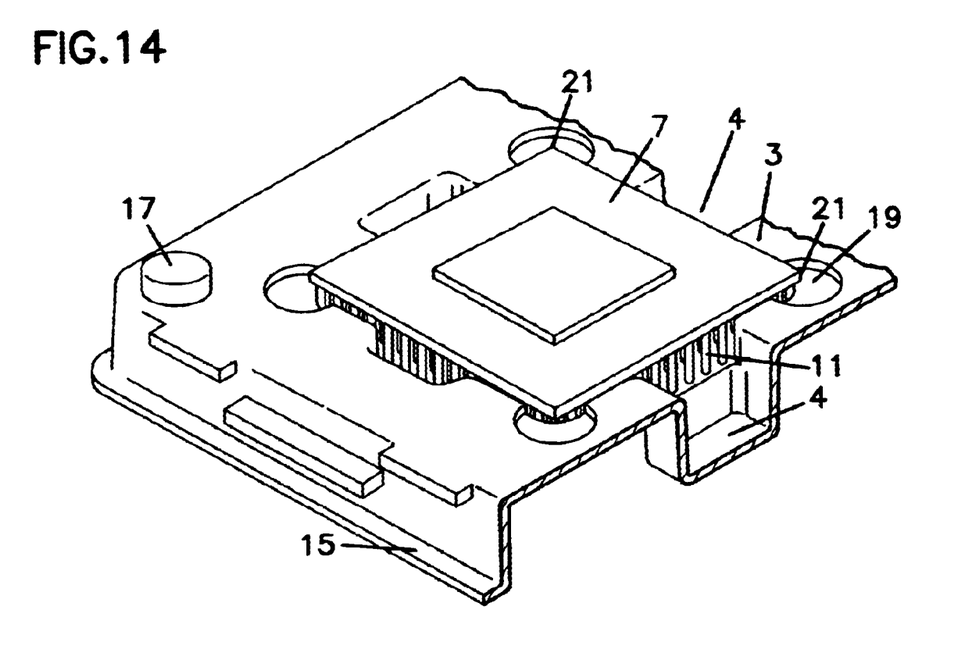
FIG. 14 shows similar view to FIG. 13 but with the integrated circuit package received in the recess.
Figure 15:
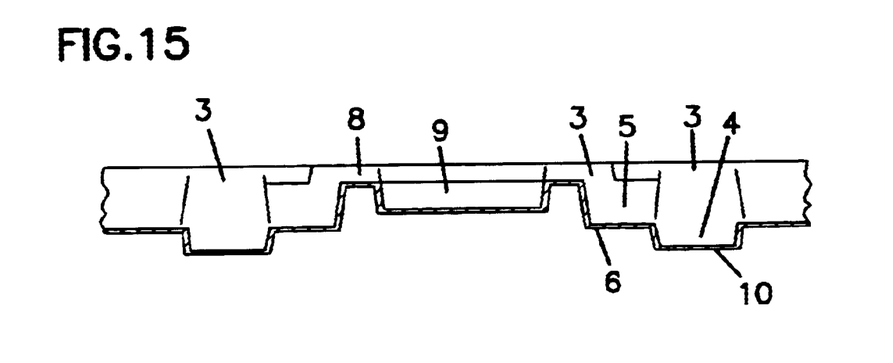
FIG. 15 shows a part cross sectional view of the storage tray of FIG. 9.
Figure 16:
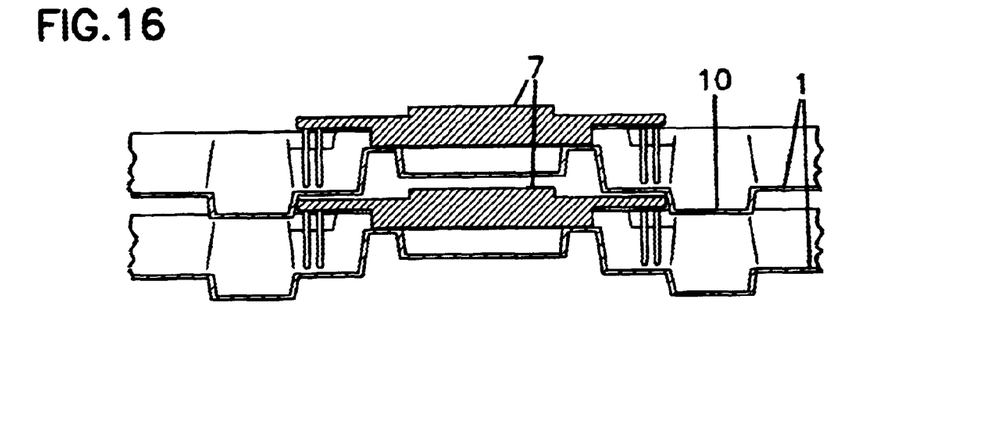
FIG. 16 shows a cross sectional view of a stack of the trays of FIG. 9 with an integrated circuit package supported on the obverse side.
Figure 17:
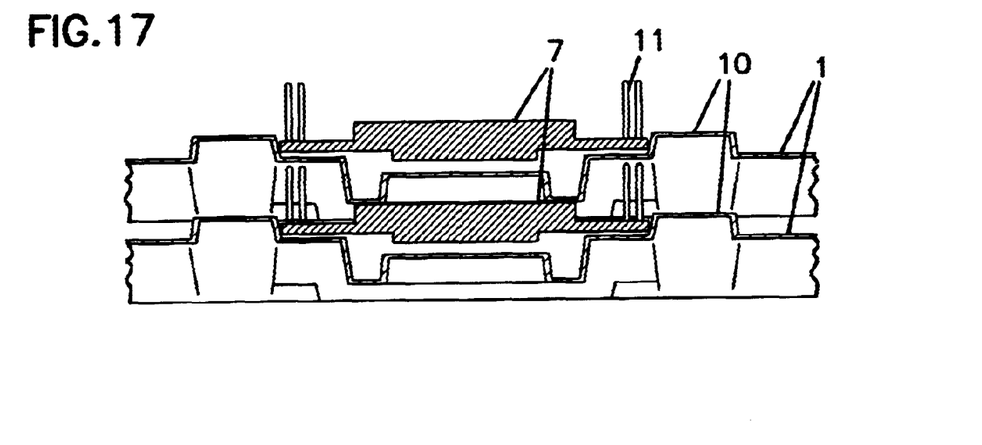
FIG. 17 shows a plurality of stacked trays of FIG. 9 in the reverse positions with integrated circuit packages supported between the projections.

The second embodiment which pertains the tray per se is shown in FIGS. 9 to 18. It will be seen that the storage tray generally shown as 1 has a number of recesses 2 in two rows and five columns. The tray is formed by drape or vacuum thermoforming and has a substantially constant wall thickness. Each recess 2 has a base 5 and a central pedestal 8. The central pedestal has a central recess 9 in it. The recess provides a support for an integrated circuit packaging 7 with the central underside 12 of the integrated circuit package supported by the pedestal 8 and the pins 11 around the pedestal but not touching the base 5 see FIG. 12. Each recess 2 is defined by a peripheral wall 3 and in the centre of each wall there is an access recess 4. The access recesses 4 extend below the level of the base such that on the obverse of the tray as can be seen in FIG. 13 and FIG. 17 the other sides of the access recesses 4 extend as projections 10 which provide together a retention area 6 for an integrated circuit package generally shown as 7 in the upside down position.

Each tray 1 has a depending rim 15 around it to provide support for the tray. On each corner of the tray is a locating pin 17 which in use engages the underside of the next tray up to facilitate stacking.

Within each recess 2 the internal portions of each wall 3 are cutaways 19 at the corners to give a clear region where the corner 21 of the integrated circuit package 7 may sit when inserted in the storage tray. This ensures that the corners of the integrated circuit package do not jamb into the corners of the recess and become difficult to remove with placement machinery.

Figure 18:
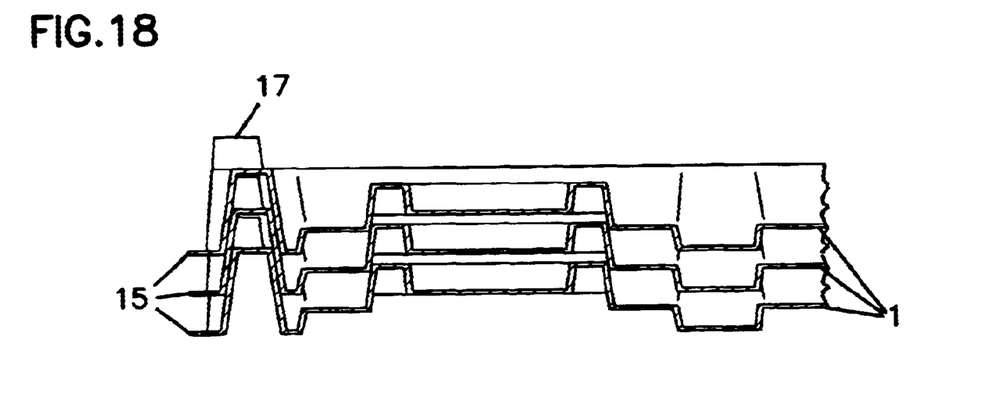
FIG. 18 shows a plurality of storage trays of FIG. 9 stacked when empty.

As can be seen in FIG. 18 when a number of the trays 1 are stacked empty the spacing between the trays is reduced so that they require a reduced volume for transport and storage.

The claims defining the invention are as follows:

1. A tray assembly for storing a plurality of integrated circuit packages, the integrated circuit packages being of a type having a body and a plurality of downwardly depending peripheral pins, and a tray being formed by drape or vacuum thermoforming, the tray assembly further including a frame joined to the periphery of the tray to provide rigidity to the tray assembly; said tray including a substantially uniform wall thickness, an obverse side of the tray having a plurality of recesses with each recess having a base and a central pedestal to engage in use an underside portion of the integrated circuit package such that the downwardly depending peripheral pins do not touch the base and upstanding walls to engage sides of the integrated circuit package, access recesses in at least some of the walls such that an integrated circuit package when supported in the recess can be engaged for removal by gripping at edges of the integrated circuit package, each access recess extending below the level of the base whereby on a reverse side of the tray the access recesses provide projections defining a retention area for an integrated circuit package with its pins facing upwards.

2. A storage tray assembly of claim 1 wherein the frame is injection moulded.

3. A storage tray assembly of claim 1 wherein the frame includes indexing lugs.

4. A storage tray for storing a plurality of integrated circuit packages, the integrated circuit packages being a type having a body and a plurality of downwardly depending peripheral pins, and a tray being formed by drape or vacuum thermoforming whereby to have a substantially uniform wall thickness, an obverse side of the tray having a plurality of recesses with each recess having a base and a central pedestal to engage in use an underside portion of the integrated circuit package such that the downwardly depending peripheral pins do not touch the base and upstanding walls to engage sides of the integrated circuit package, access recesses in at least some of the walls such that an integrated circuit package when supported in the recess can be engaged for removal by gripping at edges of the integrated circuit package, each access recess extending below the level of the base whereby on a reverse side of the tray the access recesses provide projections defining a retention area for an integrated circuit package with its pins facing upwards.

5. A storage tray as in claim 4 wherein the access recesses are provided at a middle portion of each wall and wall portions are provided at each corner of the recess.

6. A storage tray as in claim 4 further including a frame joined to the periphery of the tray to provide rigidity.

7. A storage tray as in claim 6 wherein the frame is joined to the tray by hot staking.

8. A storage tray as in claim 6 wherein the frame includes indexing lugs.

9. A storage tray as in claim 6 wherein the frame is injection moulded.

10. A storage tray as in claim 6 wherein the tray has three rows of eight recesses to hold 24 semiconductor chips.

* * * * *